United States Patent
Marwah et al.

(10) Patent No.: US 7,971,178 B1
(45) Date of Patent: Jun. 28, 2011

(54) SYSTEM TO MERGE CUSTOM AND SYNTHESIZED DIGITAL INTEGRATED CIRCUIT DESIGN DATA

(75) Inventors: Hitesh Marwah, Noida (IN); Arnold Ginetti, Antibes (FR)

(73) Assignee: Cadence Design Systems, Inc., San Jose, CA (US)

(\*) Notice: Subject to any disclaimer, the term of this patent is extended or adjusted under 35 U.S.C. 154(b) by 427 days.

(21) Appl. No.: 12/120,135

(22) Filed: May 13, 2008

(51) Int. Cl.
*G06F 17/50* (2006.01)
*G06F 15/04* (2006.01)

(52) U.S. Cl. ........ 716/139; 716/100; 716/101; 716/103; 716/105; 716/106; 716/107; 716/110; 716/111

(58) Field of Classification Search .............. 716/1–3, 716/8–14, 17–18, 100, 101, 103, 105, 106, 716/107, 110, 111, 139; 703/3–4, 13–14
See application file for complete search history.

(56) References Cited

U.S. PATENT DOCUMENTS

| 5,515,293 | A  | * | 5/1996  | Edwards ........................... 716/11 |
| 5,604,680 | A  | * | 2/1997  | Bamji et al. ....................... 716/8 |
| 5,784,292 | A  | * | 7/1998  | Kumar ............................. 716/52 |
| 6,263,479 | B1 | * | 7/2001  | Tajima ............................. 716/11 |
| 6,668,360 | B1 | * | 12/2003 | Liu ................................ 716/106 |
| 6,898,767 | B2 | * | 5/2005  | Halstead ............................ 716/3 |
| 7,177,783 | B2 |   | 2/2007  | Wu et al. |
| 7,493,574 | B2 |   | 2/2009  | Liu et al. |

OTHER PUBLICATIONS

Bales, "Facilitating EDA Flow Interoperability With The OpenAccess Design Database," Electronic Design Processes Conference 2003, http://www.eda.org/edps/edp03.

\* cited by examiner

*Primary Examiner* — Nghia M Doan
(74) *Attorney, Agent, or Firm* — Silicon Valley Patent Group; Thomas Chan

(57) ABSTRACT

Techniques are present for designing of integrated circuits. Both custom design data and synthesized digital design data are received and merged into a design database in an automated process. The design database is then made accessible to layout tools so that the layout tools may operate upon it. These layout tools can include, but are not limited to, custom tools, digitals, or a combinations of these.

17 Claims, 5 Drawing Sheets

SYSTEM TO MERGE CUSTOM AND SYNTHESIZED DIGITAL INTEGRATED CIRCUIT DESIGN DATA

BACKGROUND OF THE INVENTION

1. Field of Invention

Figure 1:
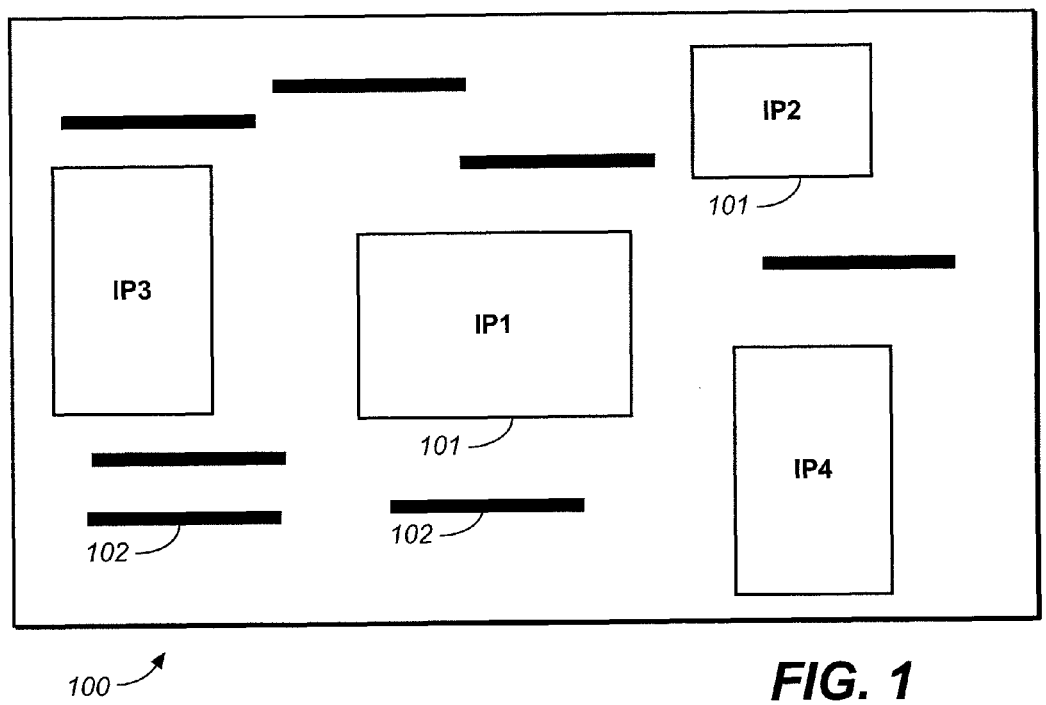

This invention relates to the merging of integrated circuit design data from a custom design flow and from a synthesized digital design flow. Many steps are in the design flow for an integrated circuit. This invention facilitates the place and route step.

2. Description of Related Art

Designing a mixed-signal integrated circuits (IC) requires a complex design flow. At the center of the flow is the place and route (P&R) step where the layout of the IC is generated. From layout, a straightforward series of steps can be taken to move the IC into manufacturing. Prior to the P&R step, several teams are involved in generating the data required for P&R. There are two primary sources of data. There are data from a custom design flow. This data primarily consist of geometric, constraint, and parameterized cell information. Custom design data includes information on the placement and floorplanning of Intellectual Property (IP) blocks, pre-routing information on power and analog wires, and placement information of guard rings. This data is typically encoded in a database. There are also data from the system teams who write data for an automated synthesized digital design flow. This data primarily consists of full connectivity data, standard cell, and timing information. The connectivity data often begins in text formats and is encoded into the database using an automated tool. To complete P&R, data from these two sources must be merged at the database level into a consistent representation that the P&R tools understand. Further, as the design process continues and as the design data input changes, the merged data must be incrementally updated. An engineering change order (ECO) defines a requirement that changes the design data input.

The traditional approach to completing the layout for the IC is not to have a single merge step, but a series of translations, targeted to allow individual tools in the flow to operate. The translators include manual copy and paste operations and the use of targeted translators that operate on the text formats. These targeted translators typically translate only sufficient information to allow a particular tool to operate. The translations are typically incomplete. As a result, many translations have to occur to complete the flow. As ECOs occur throughout the design process, these translators are continually run. The end result is a process that is error prone, time consuming, and one that results in data loss.

SUMMARY OF INVENTION

Techniques are present for designing of integrated circuits. Both custom design data and receiving synthesized digital design data are received and merged into a design database in an automated process. The design database is then made accessible to layout tools so that the layout tools may operate upon it. These layout tools can include, but are not limited to, custom tools, digitals, or a combination of these.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DRAWINGS

Figure 2:
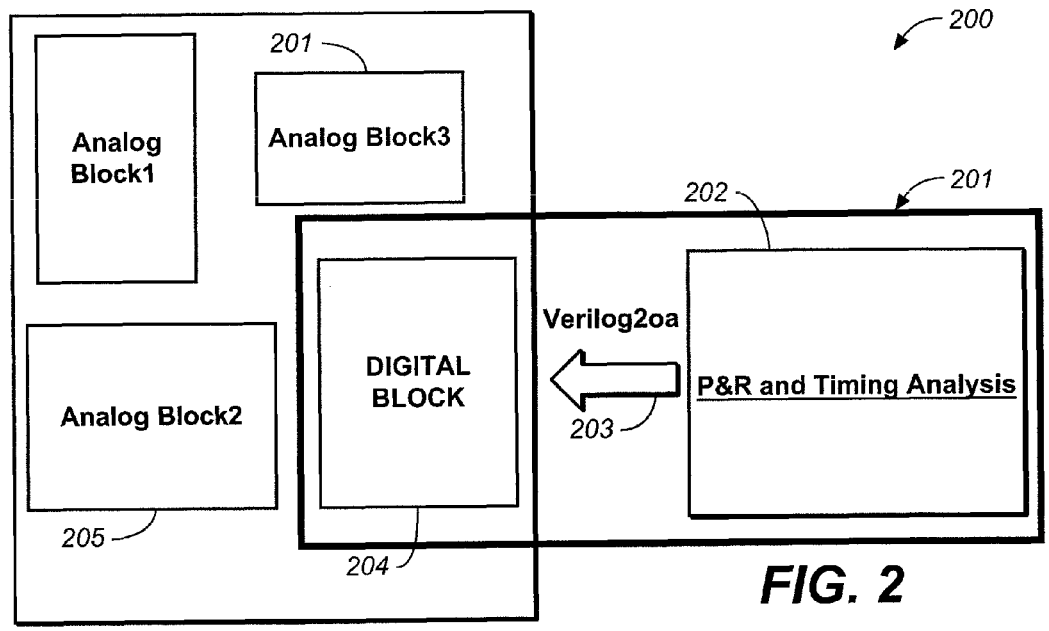
Figure 3:
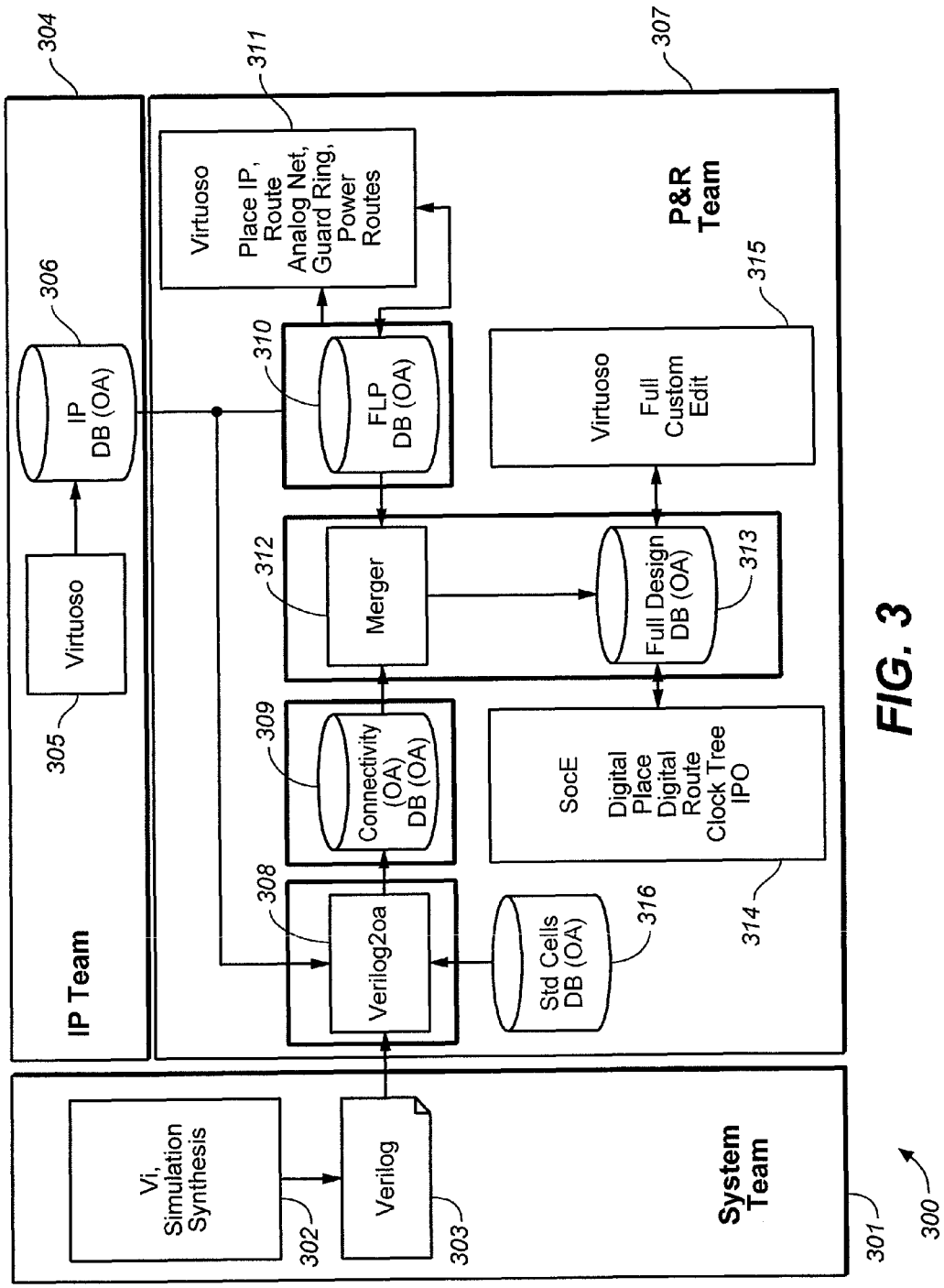
Figure 4:
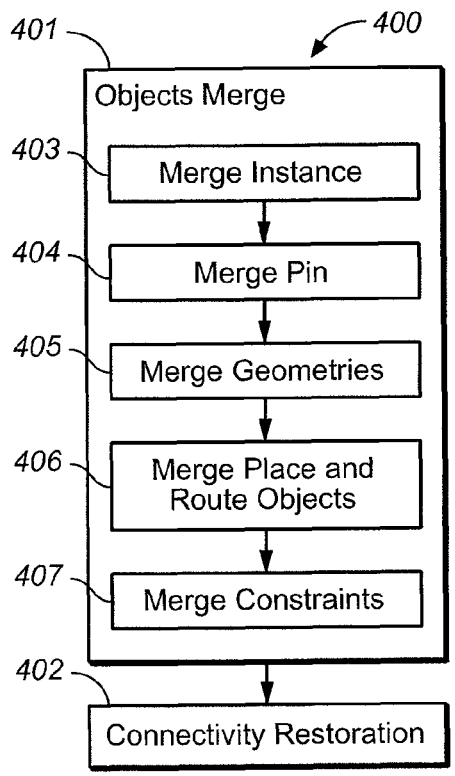
Figure 5:
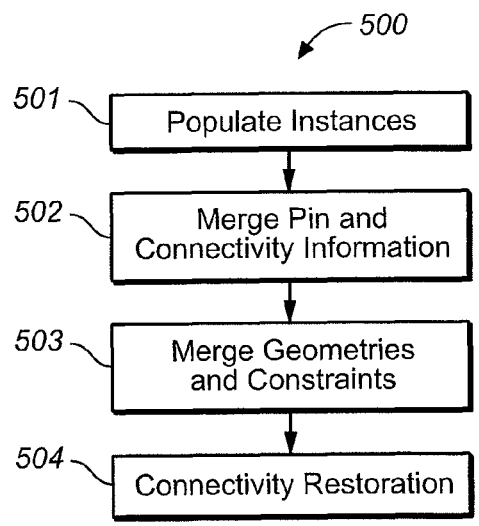
Figure 6:
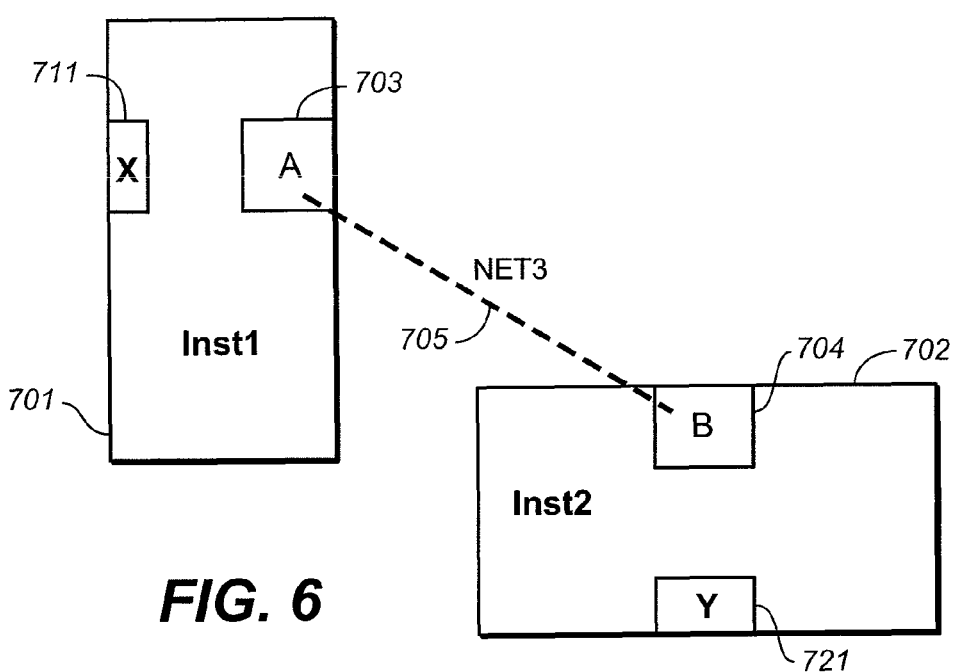
Figure 7:
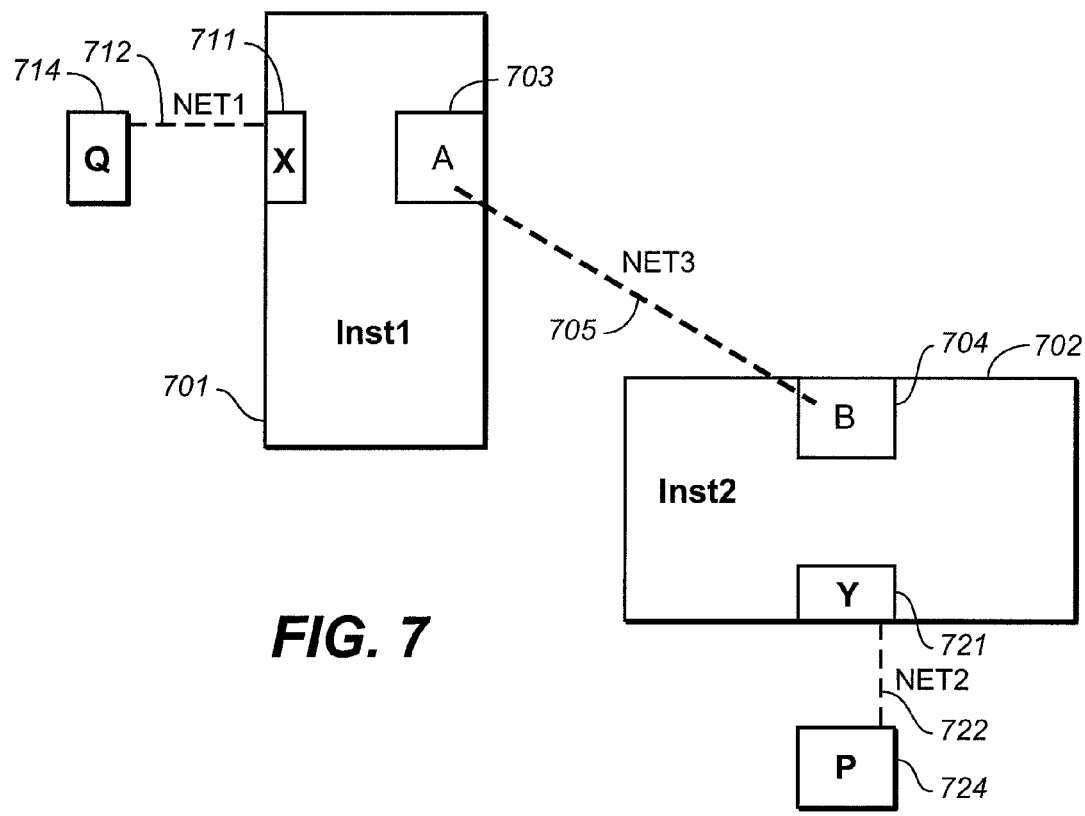
Figure 8:
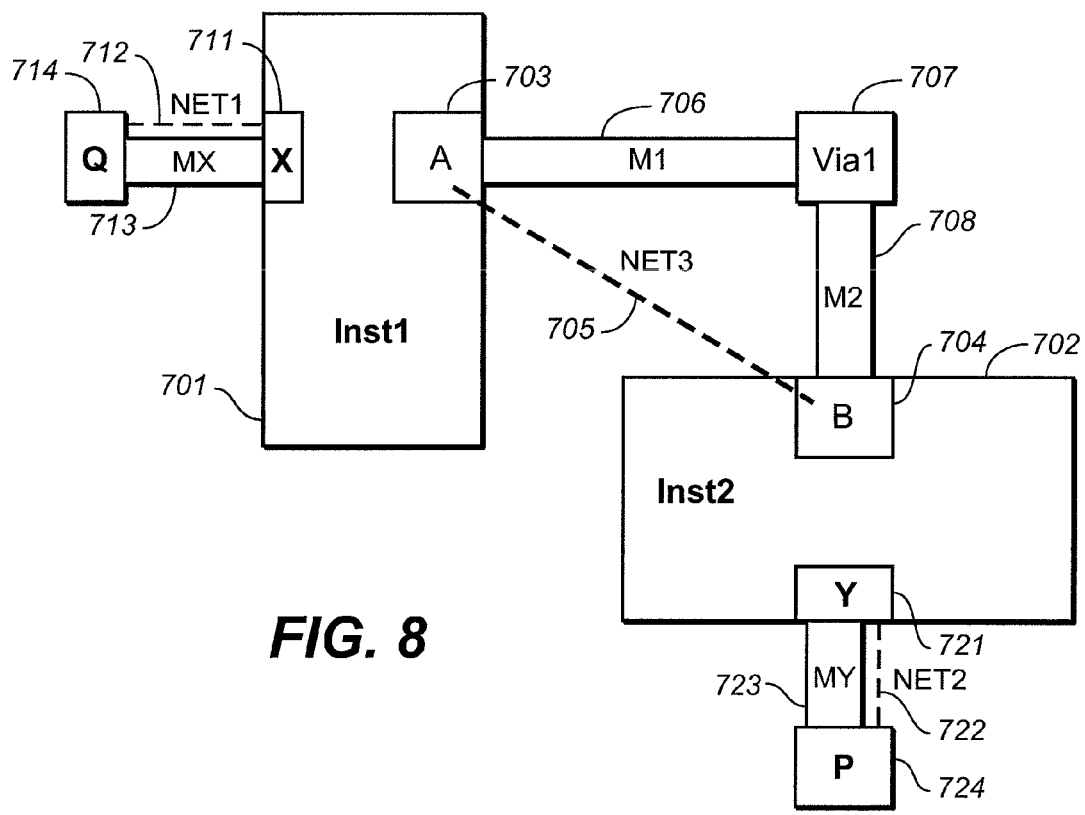
Figure 9:
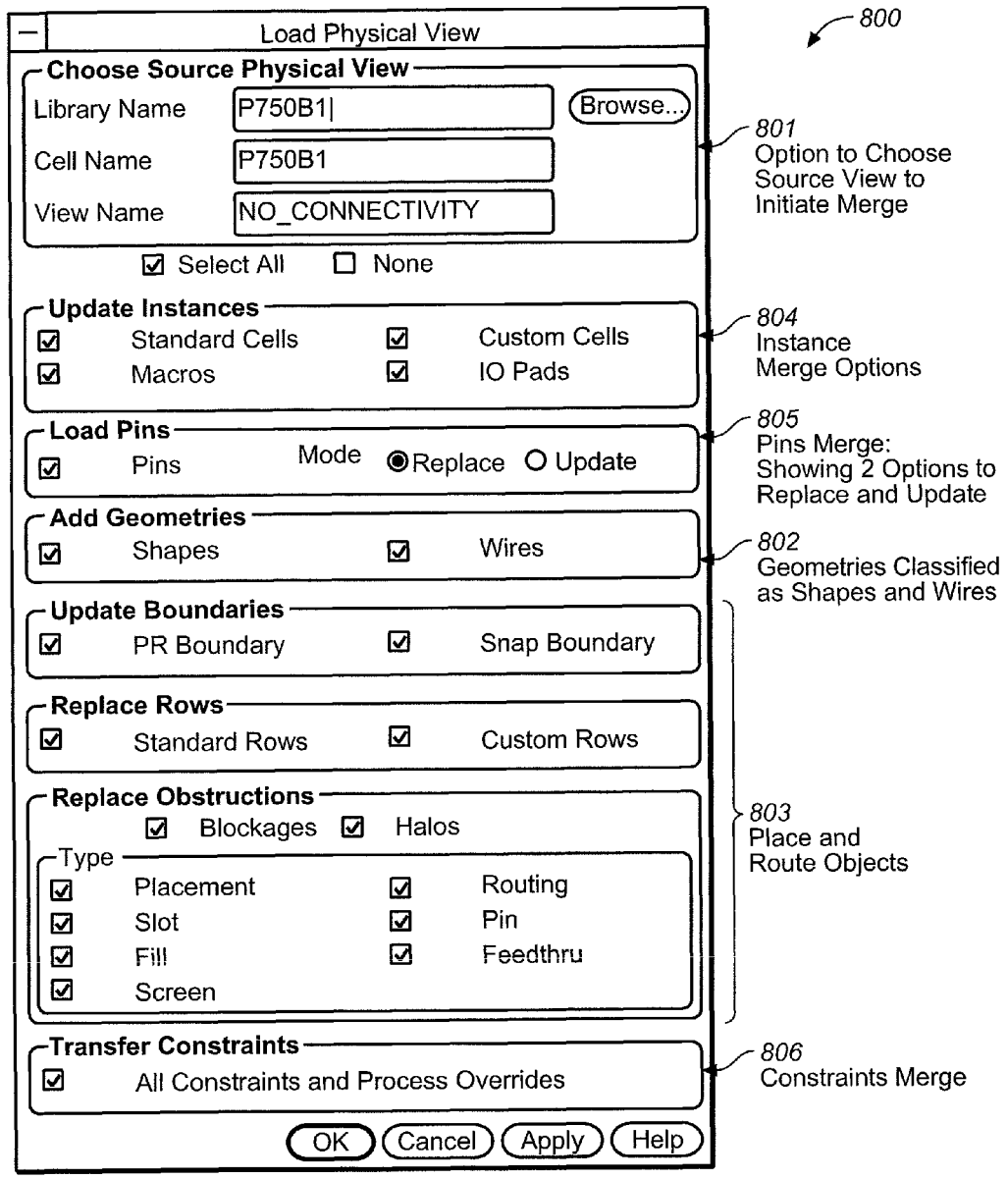

FIG. 1 shows a flat layout methodology.
FIG. 2 shows an analog-on-top flow methodology.
FIG. 3 shows the merge step in the design flow.
FIG. 4 shows the flow.
FIG. 5 shows the connectivity restoration flow
FIG. 6 shows the connectivity of net without physical connectivity shapes.
FIG. 7 shows logical connectivity and corresponding physical connectivity shapes.
FIG. 8 shows connectivity restoration.
FIG. 9 shows the user interface for the merge engine.

DETAILED DESCRIPTION

Overview

The techniques presented here provide a technology to comprehensively merge the custom design data with the synthesized digital design data into a single database, so that the place and route (P&R) tools can work on a consistent data representation for the entire design. This allows the P&R tools to work efficiently. This can help eliminate the time consuming and error prone steps from traditional approaches and allow for graceful incremental updates from engineering change orders (ECOs) to the merged data. The ECO feature is a strong requirement given that the integrated circuit (IC) design process is concurrent and that the design is continually being revised. Existing methods do not take this comprehensive and complete approach.

This invention improves the productivity of design teams. Design teams can concentrate on the quality of their work instead of spending time on the mechanical steps of merging data. Using this invention, the complex data to be merged is hidden from the user who can be overwhelmed with complex objects and connectivity in the mixed signal environment. Further advantages include correct connectivity, geometries and constraints merge without disturbing, for example, the Embedded Module Hierarchy (EMH) of the target Open Access (OA) view. Because the merge happens at the database level, no knowledge of additional file formats and corresponding translators is required. EMH is the folded module hierarchy that co-exists with design hierarchy in Open Access. Open Access is an open database for storage of connectivity, layout, and technology and wafer data. (For a discussion of Open Access, see, for example, Bales, Mark, "Facilitating EDA Flow Interoperability with the OpenAccess Design Database," paper presented at the Electronic Design Processes Conference, 2003.)

This merger technology overcomes many of the shortcomings of previous solutions. Since this does not use a text format, the learning curve, parsers, and translators associated with text formats are eliminated. The data model is completely hidden from the user. Prior, there was data loss resulting in the designer having to re-input information during ECOs. This technology provides times savings and eliminates errors in the design process.

In the exemplary embodiments, these methods facilitate the P&R of mixed-signal ICs. There are two styles of design commonly in use. The first is a flat layout style (100) shown in FIG. 1. Custom blocks 101 (Intellectual Property, IP, blocks 1-3) are placed at the same level of hierarchy as synthesized digital blocks (102). The second is an analog-on-top layout style (200) shown in FIG. 2. The digital blocks are created separately using a digital design flow (201) based on synthesis. In the synthesized digital design flow, the P&R and timing data (202) are translated from a text based format to a database (203). (This example shows verilog2oa, but both here and elsewhere, it will be understood that the cited products are just used for concrete examples and other appropriate ones can be substituted.) The digital blocks (204) are created from this data. The analog blocks (205) from a custom flow are placed at the same level of hierarchy as the digital blocks. Both styles of layout require merged custom and synthesized digital design data. The aspects presented here are applicable to both of these cases, as well as others that may be used.

The flow to merge the custom and synthesized digital data (300) is shown in FIG. 3. The creation of the synthesized digital data starts from the system team (301). They create P&R and timing data using a text editor and by running simulation and synthesis tools (302). Vi is an example of a text editor. The end result of their work is stored in a text based format (303), were Verilog is an example of a text based format. The creation of the custom data starts from an IP team (304). The IP team uses a custom layout tool (305) to generate layout which is stored in a database (306). Virtuoso is an example of a custom layout tool. It should also be noted that in all of the embodiments presented here, the system team (301) and IP team (304) can work in parallel, further enhancing productivity.

At the center of the flow is the P&R team (307). They make modifications on the data received prior to the merge of data. The data from the system team is translated (308) and combined with a standard cell database (316) into a database that stores the connectivity information (309). Verilog2oa is an example of a translator. A floorplan database (310) is created by adding placement and routing information using a custom layout tool (311). The merge (312) combines the connectivity database and the floorplan database to create a single database (313) that contains the full design. By having a database that contains the full design, both the digital layout tools (314) and the analog layout tools (315) can operate on it. The tools can be run in any order and without data loss.

The merge flow (400) shown in FIG. 4 consists of two main parts. Object merge (401) adds or updates physical data to the database. The exemplary embodiment has five elements in which five different types of objects are merged. The objects are instance information (403), pin information (404), geometries (405), place and route objects (406), and constraints (407). These all allow re-use of information. Connectivity restoration (402) adds connectivity information to the database from custom data that is missing connectivity information.

In the integrated circuits design process (300), ECOs occur. When they do, the data from the IP team (306) and the data from the system team (303) are changed. The data (306) includes the source layout. Because additional data was added in the merger (312) from previous iterations of the design flow (300), during an ECO iteration, the merger (312) has the additional task of updating the full design data (313) without losing the added data that were made during previous iterations of the merger (312). The full design data (313) includes the target layout.

1. Objects Merge

In objects merge, design objects, which may or may not constitute connectivity, are merged from the source layout database to the target layout database. A primary task of object merge is to accommodate ECOs without data loss.

1.1. Merge Instance Information

Instances are the layout blocks (101) on the IC. They are produced by the IP team and stored in an IP database (306). Instances form the majority of the layout. This is one of the steps that accommodate ECOs without data loss. From previous design iterations, connectivity data can be added or removed to the instances in the connectivity restoration (402). In the merge instance (403), the instance information in the full design data (313) is updated as a result of ECOs input data (306) changes. Instance information that is updated includes the orientation, location, and placement status of the instances.

Each instance has a master from which it is derived. There can be many instances of a master. There is only one master for every instance. To determine which instances are to be updated, two heuristics are applied. The first is to match the instances by instance name. The second is to match the instances by master name. Matching the instance names requires an advanced search mechanism. The search mechanism applies several techniques. It can search the EMH found in the full database (313). In various data formats, there are several notations to represent instance hierarchies. This search mechanism can map from one mechanism to another such as mapping the back tick notation to the pipe notation. It can correctly map the leading character pipe notation to the ones without this notation.

Once the search is complete, selective updates on all or any of one of the instances found can be done. Updating the master is very powerful feature especially in the flow where data is continuously fed from a netlist. In addition re-mastering can also be done for an embedded module instance in the target layout with that of design instance in the source layout. Parameterized cell re-mastering is also done in which abutment is taken care of automatically.

1.2. Merge Pin Information

Pins in the layout are the access points to other layouts or to outside of the integrated circuit. Pins form part of the connectivity information. Two modes are used in the pin merge (404). The two modes are replace mode and update mode. Replace mode is the default and most prevalent. In this mode, all of the pins in the source layout are deleted and replaced with the pins in the target layout. Because the pins are added as connectivity placeholders to the layout, removal of the pins does not disturb the connectivity. In update mode, there is first an attempt to match the pin and pin-figure name. If the source pin and its pin-figure name match with that of the target pin its pin-figure, it is updated from source layout. If the name matching fails, the pin is created in target layout corresponding to source layout.

Merge pin handles several complexities. Scalarization is the process of promoting single bit connectivity and demoting multi-bit connectivity in the OA database. Merge pin handles scalarization of the target data before name mapping begins. The scalarization of design is necessary because the connectivity data is generally un-scalarized where as the layout data is scalar in nature because each terminal vector bit has a corresponding pin and pin-figure associated in the physical domain. So unless scalarization of connectivity data is done no sensible merging can take place. Merge pins also handles correct mapping of terminal vector bits between the various name spaces, or formats, that are supported and their representations of vector pins (e.g., such as between the angular bracket notation of the CDBA name space and the square bracket notation of the Verilog name space.

1.3. Merge Geometries

Geometries are the bulk of the information found in the layout. Geometries include shapes such as polygons, rectangles, ellipses, dough-nuts, and paths. Geometries also include relative object design (ROD) objects. Examples of ROD objects are multipart paths (MPP) and figure groups. Associated with connectivity, geometries include path segments and vias. Shapes, ROD, path segments, and vias are first class objects. Geometries that are associated with these first class objects are pin-figures and module generators. Module generators are arrayed parameter instances also known as super parameterized cells. The merge geometries (405) transfers the data from the source layout to the target layout. Special care is required to handle the merging of pin-figures and module generators. Pin figures are associated with pin objects and so their merging is done with pin objects. Module generators are complex figures that are interpreted as constraints, so their merging is done with constraints transfer. The merge geometries handle other complexities such as the handling of sub-shapes associated with objects such as MPP used in the creation of guard rings.

1.4. Merge Place and Route Objects

Placed and route objects are planning objects used to guide placement. As with the other elements of the merge process, the merge place and route objects (406) enable the re-use of this information. The designer does not have to re-specify this data. Place and route objects include place and route boundaries, rows, blockages, and halos. These objects do not add to connectivity, but need to be merged to prevent data loss. The merge place and route transfers this data from the source layout to the target layout. The merge place and route handles complexities such as interpreting cluster and cluster boundaries as constraints so that the merge of these objects happen using constraints transfer from source to target layout. This allows the user to select which types of objects to merge. This step handles the complicated data model used to implement these objects. Hidden, for example, is that custom rows are implemented as figure groups. These details are hidden from the user.

1.5. Merge Constraints

Constraints are objects that help the designer achieve the design goals and aid in maintaining the manufacturability of the layout by enforcing process rules. There are two broad categories of constraints. There are relationship constraints such as alignment and symmetry. There are process rule overrides such as minimum spacing and minimum width value overrides. All of these constraints can be viewed in a constraints manager and merging is required to prevent data loss. The merge constraints (407) transfers this information from the source layout to the target layout. The merge constraints handles the complexities due to objects being both first class objects and constraints. Constraints typically have higher priority, so merging will happen using the constraints merger mechanism. Examples of first class objects that fall in this situation include module generators and cluster and cluster boundaries.

2. Connectivity Restoration

After the objects merge (401), the connectivity restoration (402) can be applied. The connectivity restoration automatically merges data from the connectivity database (309) and the data created from the objects merge. The data in the connectivity database is considered correct and is not changed during this action.

The exemplary embodiment of the connectivity restoration (500) is shown in FIG. 5. Populate instances (501) adds instance location and orientation to the full design database (313) and can not only bring in instances, but also instance pins. The merge pin and connectivity (502) determines which pins, including those from the top design and instance pins to associate with which nets. Merge geometries and constraints (503) will bring in the shapes and connectivity restoration (504) identifies overlaps and assigns nets to geometry. Complex shape chasing algorithms are applied during this action. An example of this process can be illustrated with use of FIGS. 6-8.

Example and Options

FIG. 6 shows an example of a net, NET3 (705) that is associated with pin A (703) and with pin B (704). The pins respectively each belong to an instance, Inst1 (701) and Inst2 (702), which also have the respective pins X (711) and Y (721). Populate instances (501) brings in these instances and their instance pins (Inst1: A, X and Inst2: B, Y). The association of pins A and B by NET3 is made by matching the instances and pins with data from the connectivity database. Merge pin (502) brings in the top design pins P (724) and Q (714), as shown in FIG. 7 and the connectivity information again leads to the connections along NET1 712 and NET2 722. In FIG. 8, the geometries are merged (503) and the shapes M1 706, M2 708, Via1 707, MX 713, and MY 723. Connectivity restoration (504) then identifies overlaps and assigns nets to geometries: M1, M2, Via1 is assigned NET3; MX is assigned NET1; and MY is assigned NET2. If there is an inconsistency in the connectivity information generated from the two steps, an error indicating a short circuit or open circuit is provided to the user. The user then can fix the error by eliminating the geometric overlap or changing the logical connectivity. When all of the errors have been eliminated, the merge is considered complete.

FIG. 9 shows some examples of options available (800) to the user when starting the merger (312). FIG. 9 shows an exemplary embodiment of a screen that would be presented to the user on the display of a computer system on which the various techniques described here could be implemented. These options can include: choosing the data to merge (801); what classification to use for geometries (802); options on place and route objects (803); instance merge options (804); pin merge options (805); and how constraints are to be merged (806). According to the embodiment, other options can be included; and the particular choices shown the options in FIG. 9 are just one exemplary embodiment.

CONCLUSION

Many aspects of the methods of the present invention will most commonly be implemented in software as a computer program product, although many of these can be implemented in hardware or by a combination of software and hardware. For example, FIG. 9 is an example of a presentation on a display of a computer system running such a software product. Further, the different operations described may be executed in various orders, or using different specific products, other than those of the exemplary embodiments while still maintaining various aspects of the present invention. As will be understood in the art, the invention or components thereof may be embodied in a fixed media program component containing logic instructions and/or data that when loaded into an appropriately configured computing device cause that device to perform according to the invention. As will be understood in the art, a fixed media program may be delivered to a user on a fixed media for loading in a user's computer or a fixed media program can reside on a remote server that a user accesses through a communication medium in order to download a program component. Examples of such fixed media include a disk-type optical or magnetic media, magnetic tape, solid state memory, etc. The invention may be embodied in whole or in part as software recorded on this fixed media. Various details related to using a computer system or as a computer program product for this purpose can be found, for example, in U.S. Pat. No. 7,177,783 or U.S. patent application Ser. No. 11/361,928.

Although the various aspects of the present invention have been described with respect to certain embodiments, it is understood that the invention is entitled to protection within the full scope of the appended claims.

It is claimed:

1. A method of designing an integrated circuit, comprising:
   receiving custom design data;
   receiving synthesized digital design data;
   receiving data updates, wherein the data updates include changes to the custom design data and the synthesized digital design data;
   merging in an automated process the received data updates, the received custom design data and the received synthesized digital design data into a design database, wherein said merging includes performing an object merge operation, and wherein performing an object merge operation includes merging instance information; merging pin information; merging geometries, merging place and route objects and merging constraints; and
   making the design database accessible to one or more layout tools so that the layout tools operate thereupon.

2. The method of claim 1, wherein the layout tools include analog layout tools and digital layout tools.

3. The method of claim 1 wherein the data updates include incremental updates in response to engineering change orders, wherein the incremental updates include data from previous design iterations of the integrated circuit.

4. The method of claim 1, wherein said merging further includes:
   performing a connectivity merge operation.

5. The method of claim 4, wherein performing a connectivity merge operation includes one or more of:
   instance population;
   merging pin and connectivity information; and
   merging geometries and constraints.

6. The method of claim 1, wherein the constraints include relationship constraints and process rule overrides.

7. The method of claim 1, wherein the merging in an automated process is responsive to user input including one or more of: choice of data to merge; instance merge options; pin merge modes; classification to use for geometries; options on place and route objects; and how to transfer constraints.

8. A computer program product for designing an integrated circuit, including a non-transitory computer readable storage device storing executable program code, the computer program product comprising code for performing the method of:
   receiving custom design data;
   receiving synthesized digital design data;
   receiving data updates, wherein the data updates include changes to the custom design data and the synthesized digital design data;
   merging in an automated process the received data updates, the received custom design data and the received synthesized digital design data into a design database, wherein said merging includes performing an object merge operation, and wherein performing an object merge operation, includes merging instance information; merging pin information; merging geometries, merging place and route objects and merging constraints; and
   making the design database accessible to one or more layout tools so that the layout tools operate thereupon.

9. The computer program product of claim 8, wherein the layout tools include analog layout tools and digital layout tools.

10. The computer program product of claim 8, wherein the data updates include incremental updates in response to engineering change orders, wherein the incremental updates include data from previous design iterations of the integrated circuit.

11. The computer program product of claim 8, wherein said merging further includes:
    performing a connectivity merge operation.

12. The computer program product of claim 8, wherein the merging in an automated process is responsive to user input including one or more of choice of data to merge; instance merge options; pin merge modes; classification to use for geometries; options on place and route objects; and how to transfer constraints.

13. A system for a design process of an integrated circuit, comprising:
    a user interface for viewing representations of the integrated circuit on a display and receiving user inputs; and
    at least one processing unit including circuitry to aid in a design process for an integrated circuit, the design process including, receiving custom design data; receiving synthesized digital design data; receiving data updates, wherein the data updates include changes to the custom design data and the synthesized digital design data; merging in an automated process the received data updates, the received custom design data and the received synthesized digital design data into a design database, wherein said merging includes performing an object merge operation, and wherein performing an object merge operation includes merging instance information; merging pin information; merging geometries, merging place and route objects and merging constraints; and making the design database accessible to one or more layout tools so that the layout tools operate thereupon.

14. The system of claim 13, wherein the layout tools include analog layout tools and digital layout tools.

15. The system of claim 13, wherein the data updates include incremental updates in response to engineering change orders, wherein the incremental updates include data from previous design iterations of the integrated circuit.

16. The system of claim 13, wherein said merging further includes:
    performing a connectivity merge operation.

17. The system of claim 13, wherein the merging in an automated process is responsive to user input including one or more of: choice of data to merge; instance merge options; pin merge modes; classification to use for geometries; options on place and route objects; and how to transfer constraints.

* * * * *